United States Patent [19]
Durschlag et al.

[11] Patent Number: 4,458,295
[45] Date of Patent: Jul. 3, 1984

[54] LUMPED PASSIVE COMPONENTS AND METHOD OF MANUFACTURE

[75] Inventors: Mark S. Durschlag, Natick; James L. Vorhaus, Newton, both of Mass.

[73] Assignee: Raytheon Company, Lexington, Mass.

[21] Appl. No.: 440,479

[22] Filed: Nov. 9, 1982

[51] Int. Cl.³ .................. H01G 4/10; H01G 7/00; H01L 27/02
[52] U.S. Cl. .................. 361/322; 29/25.42; 357/51
[58] Field of Search .................. 29/25.42; 357/51; 361/322

[56] References Cited

U.S. PATENT DOCUMENTS 3,257,592 6/1966 Maissel .................. 361/322 X
3,864,817 2/1975 Lapham et al. .................. 357/51 X

FOREIGN PATENT DOCUMENTS 55-17504 5/1980 Japan .................. 29/25.42
56-48108 8/1981 Japan .................. 357/51

Primary Examiner—Donald A. Griffin
Attorney, Agent, or Firm—Denis G. Maloney; Richard M. Sharkansky; Joseph D. Pannone

[57] ABSTRACT

Lumped passive components including a capacitor having a silicon nitride dielectric, a tantalum film resistor, and a capacitor having a tantalum oxide dielectric are formed on a semi-insulating substrate by first providing an insulating layer, here of silicon nitride, over the substrate and metal contacts having previously been formed on such substrate. The metal contacts provide a first plate for each one of such capacitors. A tantalum layer is reactively sputtered on the insulating layer, and a protective masking layer is next provided on such tantalum layer. An area where the anodized tantalum capacitor is to be formed is then opened in the protective masking layer over a selected one of the metal contacts. A portion of the tantalum is anodized in such area to form an area of a tantalum oxide ($Ta_2O_5$). The area where the tantalum oxide is formed is confined generally to the area in the tantalum layer over the contact. The masking layer is removed and a second masking layer is patterned to provide an etching mask used to etch the tantalum layer to define each one of such capacitors, and to provide a strip of tantalum, defining a region for said tantalum resistor. Top metal contacts are then provided aligned with the first set of such contacts, and thus providing a second metal plate of the anodized tantalum capacitor and a second metal plate of the silicon nitride capacitor. Further, a set of metal contacts is provided to each end of the tantalum strip to provide the tantalum resistor.

14 Claims, 9 Drawing Figures

LUMPED PASSIVE COMPONENTS AND METHOD OF MANUFACTURE

BACKGROUND OF THE INVENTION

This invention relates generally to radio frequency (r.f.) integrated circuits and more particularly to fabrication of lumped passive circuit components.

As is known in the art, resistors and capacitors are generally required in amplifier circuit applications. In particular, when an amplifier employing field effect transistors (FETS) and r.f. transmission lines is to operate over a radio frequency range of frequencies, resistors and capacitors are needed to match the impedance of the FET so that of the transmission lines. Such capacitors typically have values of capacitance between 0.1 and 4.0 picofarads (pf). Capacitors are also required to provide filtering of bias lines provided to the circuit. These capacitors are generally much larger in value than the aforementioned capacitors typically having values of capacitance in the range of 30-60 pf. When fabricating capacitors having a capacitance in the range of 0.1 to 4 pf, silicon nitride is often used as the dielectric. However, with a relatively low dielectric constant of 7, large capacitors using a very large portion of the circuit area would be required to provide capacitors having a capacitance in the range of 30-60 pf. Further, a capacitor having such a large area may in some applications negate the lumped element characteristic of the capacitor due to its relatively large size in comparison to the wavelength of r.f. signals fed thereto. Thus, other materials with higher dielectric constants are used to reduce the ratio of the capacitance of the capacitor to the area of the capacitor. One such material is tantalum oxide.

To provide a capacitor having a tantalum oxide dielectric, the tantalum oxide must be either deposited or grown. In depositing a tantalum oxide film, one problem is maintaining uniformity of the film. When growing tantalum oxide, the major problem involves providing a layer of tantalum (from which the tantalum oxide is grown) having no surface defects. Since surface defects are common, this approach generally has not been very successful in providing capacitors having tantalum oxide dielectrics. In particular, portions of the circuit where the substrate has deposited therein metallization steps from prior processing steps are particularly susceptible to formation of defects in the tantalum film. Prevention of defects is important because during growth of a tantalum oxide film, the existence of a defect may cause a short circuit between the tantalum layer and the substrate, and thus causing damage to the substrate.

SUMMARY OF THE INVENTION

In accordance with the invention, an anodic oxide capacitor is formed on a substrate having a contact thereon, by first forming an insulating layer over the substrate and the contact. The contact provides the first plate of such capacitor. The insulating layer is provided to protect the substrate during a subsequent anodization process, and to increase the resistance of the substrate. A layer of a valve metal such as tantalum is deposited on the insulating layer and a masking layer is next deposited over the tantalum layer. The masking layer is patterned to expose a region aligned with the first contact. The exposed region of the tantalum layer is anodized converting such region of the tantalum layer into a tantalum oxide layer. Next, the masking layer is removed and the tantalum oxide layer is etched to define the capacitor, and a second plate of the capacitor is formed in alignment with the first plate. With such an arrangement, the insulating layer protects the surface of the substrate from defects in the tantalum layer which might cause a short in the substrate during the anodization of the tantalum. Further, the insulating layer can serve as the dielectric for other types of capacitors, thus such capacitors can be formed concurrently with the anodic oxide capacitor. Further still, the insulating layer may also serve as a surface passivation layer where required.

BRIEF DESCRIPTION OF THE DRAWINGS

The foregoing features of this invention, as well as the invention itself, may be more fully understood from the detailed description read together with the accompanying drawings, in which.

DESCRIPTION OF THE PREFERRED EMBODIMENT

Figure 1:
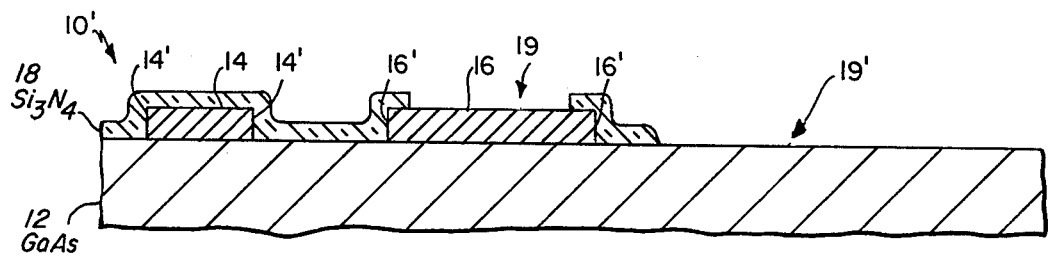
FIGS. 1-6 are a series of cross-sectional views showing the steps in the construction of lumped passive components in accordance with the invention.
Figure 6:
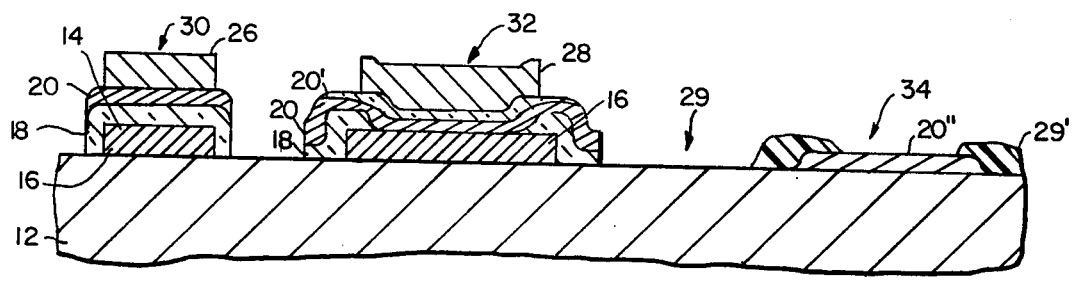
Figure 7:
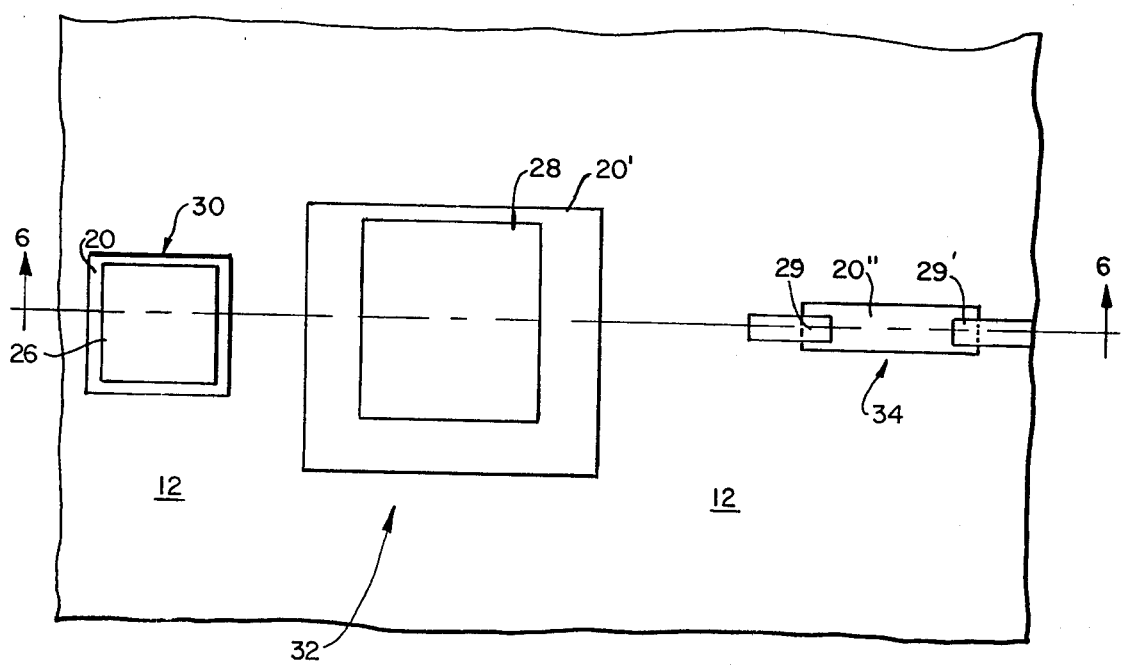
FIG. 7 is a plan view of FIG. 6.

Referring first to FIG. 1, a substrate 12, here of semiinsulating gallium arsenide (GaAs) is shown to include a pair of metal contacts 14, 16. Metal contacts 14, 16 are here layers of gold, germanium and nickel formed on substrate 12, and patterned in a conventional manner. After formation of metal contacts 14, 16, a dielectric layer 18 here of silicon nitride ($Si_3N_4$) 5000 Angstroms (A) thick, is plasma deposited over the entire substrate 12 and metal contacts 14, 16, as shown. The silicon nitride layer 18 is here provided to form a dielectric layer in a manner to be described in conjunction with (FIGS. 6, 7) of a capacitor having a small value of capacitance, such as might be used for impedance matching between FET's. In addition, the dielectric layer 18 is provided to improve the yield of large value capacitors by insulating edge portions of a valve metal layer which may cross over steps 14', 16' provided by here metal contacts 14, 16 so that during anodization of a portion of the valve metal layer, any defects in such layer, particularly those occuring over steps 14', 16' will not cause a short circuit between the valve metal layer and the substrate. Further, the dielectric layer may be used for passivation of the surface or substrate 12 if required. The dielectric layer 18 is patterned in selective areas here using a freon plasm etch to provide apertures 19, 19' therein, as shown. The aperture 19 is here formed in a region aligned over the metal contact 16 where an anodic-oxide capacitor will be formed and the aperture 19' is provided in a region where a valve film resistor will be formed, as shown in FIGS. 6 and 7. Suffice it here to say that apertures 19, 19' provide windows wherein a valve metal (to be described in conjunction with FIG. 2) is provided in electrical contact with substrate 12 to provide a resistor, and with metal contact 16 defining an area where the anodic oxide of such valve metal may be provided to form the dielectric of a capacitor.

Figure 2:
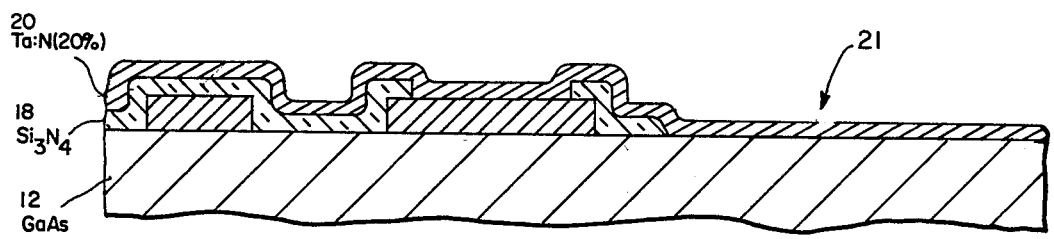

Referring now to FIG. 2, a layer 20 here of a valve metal such as tantalum, here 3000 Å thick, is reactively sputtered over the entire surface of substrate 12. The tantalum layer 20 is reactively sputtered as follows: an inert sputtering gas, here argon (used in a gas discharge apparatus to remove portions of tantalum from a tantalum target and to sputter deposit said portions on the substrate 12) is provided in a suitable vessel (not shown) containing the substrate 12 and a tantalum souce (not shown); a 1% partial pressure of nitrogen ($N_2$) is introduced into the vessel; and during a gas discharge of the argon, portions of the tantalum source are carried away from the source and are deposited on the substrate 12. Also deposited on the substrate 12 with the tantalum layer 20 is nitrogen ($N_2$). Thus, a layer 20 is formed having a nonstoichiometric structure of tantalum and nitrogen. The tantalum layer 20 here has a 20 atomic percentage nitrogen content (Ta:N:(20%)). Nitrogen, a nonstoichiometric formation agent, is here added to enhance certain electrical characteristics of the passive components as will be described in conjunction with FIGS. 6, 7. In areas corresponding to the aperture 19 (FIG. 1), the tantalum layer 20 is provided in mechanical and electrical contact with the metal contact 16. Further, as shown in FIG. 2, the tantalum layer 20 is also deposited through aperture 19' along a portion 21 of the substrate 12. This area 21 will be used to fabricate a thin film tantalum resistor in a manner to be described in conjunction with FIGS. 5 and 6.

Figure 3:
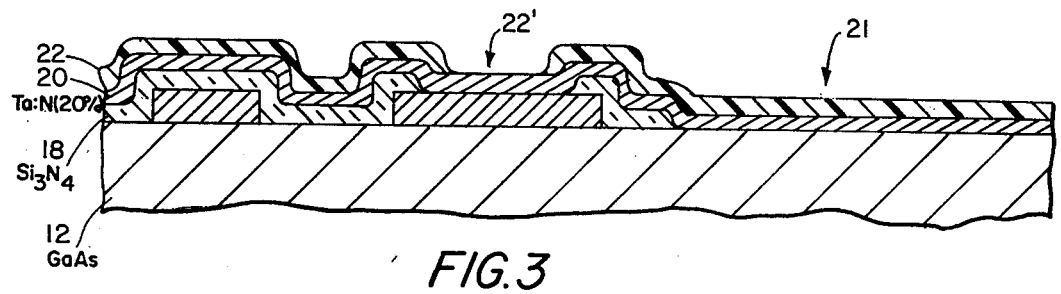

Referring now to FIG. 3, a photoresist layer 22 is deposited over the entire surface of the substrate 12. The photoresist layer is patterned in selective locations providing an aperture 22' therein, said aperture 22' (aligned with here metal contact 16) providing an area where a tantalum oxide capacitor is to be formed. The photoresist layer 22 is here provided to permit selective anodization of the tantalum layer 20 to form a layer of tantalum oxide in a manner to be described in conjunction with FIGS. 4, 8 and 8A. Therefore, as shown in FIG. 3, the photoresist layer 22 is provided over metal contact 14 and over the area of tantalum layer 20 in the portion 21 where the tantalum resistor will be formed.

Figure 4:
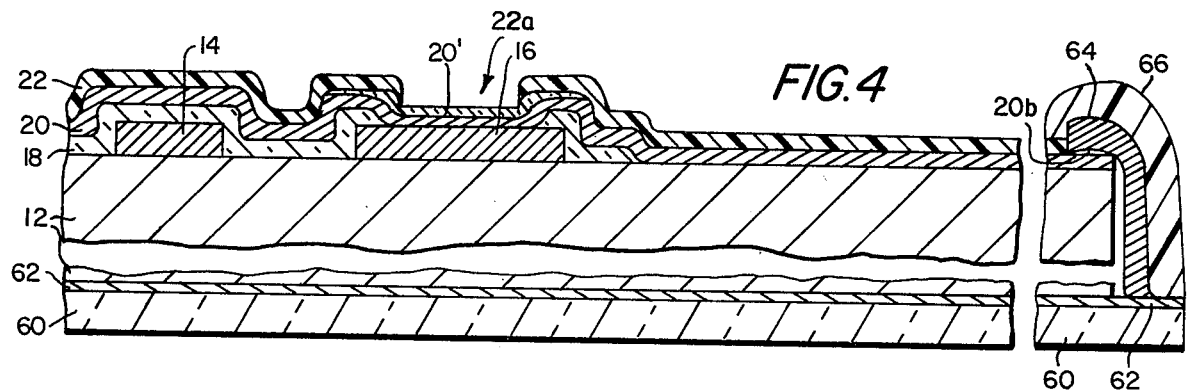
Figure 8:
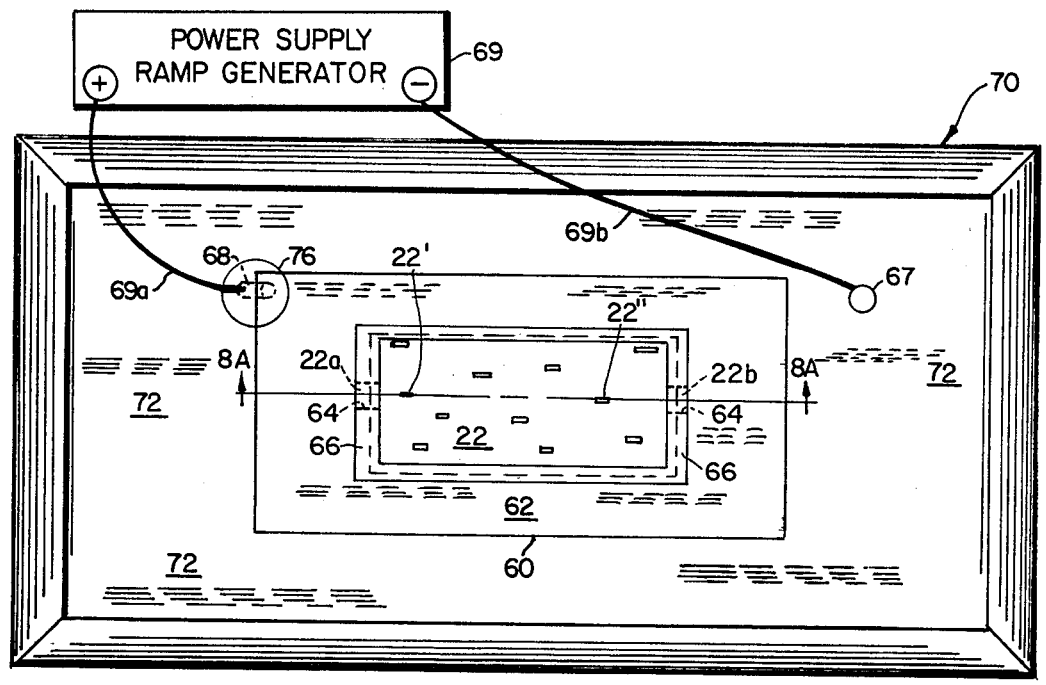
FIG. 8 is a plan view of an apparatus used during the anodic growth of a dielectric film.
Figure 8A:
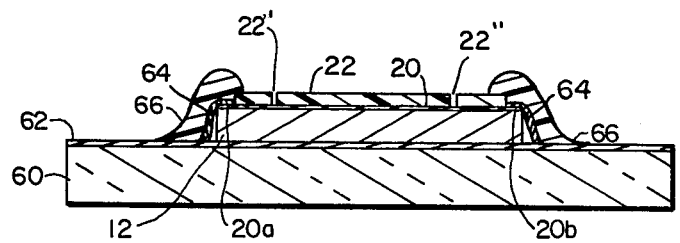
FIG. 8A is a cross-sectional view of a portion of FIG. 8.

Referring now to FIGS. 4, 8 and 8A, a layer 20' of tantalum oxide ($Ta_2O_5$) is formed in the aperture 22' of photoresist layer 22. The tantalum oxide layer 20' is formed therein as follows. As shown, the substrate 12 is mounted on a glass slide 60 upon which has previously been deposited a tantalum layer 62. Portions of the photoresist layer 22 (FIG. 3) deposited on substrate 12 are removed, exposing underlying portions 20a, 20b of the tantalum layer 20. A silver paint 64 (a solution of silver particles suspended in a carrying agent commercially available from G. C. Electronics, Division of Hydrometals, Rockford, Ill. is applied over such portions 20a, 20b to provide electrical contacts between the tantalum layer 20 and the tantalum layer 62. Portions of the slide 60 adjacent the substrate 12, and the silver paint portions are then coated with a suitable wax 66 to electrically insulate the side portions of the substrate 12. Electrical contact is made to tantalum layer 62 such as with a clip 68 as shown in FIG. 8. The clip 68 electrically insulated here in a wax layer 76 is attached to a power supply/ramp generator 69, via a first line 69a, here the positive voltage level of the power supply. The negative side of the power supply is connected, via a line 69b to here a tantalum electrode 67. The electrode and the substrate 12 are submerged in a tub 70 containing therein a suitable electrolytic solution 72, here citric acid. In accordance with the invention, the tantalum layer 20 which is selectively exposed through the aperture 22' in the photoresist layer 22, is anodized in such area by feeding a voltage ramp signal of 100 volts between the tantalum layer 62 and hence the tantalum layer 20, and the electrode 67. The voltage signal is here a ramp voltage signal with an initial value of 0 volts and a peak value of 100 volts. The ramp voltage builds up here over a period of approximately ½ hour. When the voltage signal reaches 100 volts, the voltage level is maintained at 100 volts for a period of approximately 10 minutes to enhance the quality of the tantalum oxide film produced. Here the voltage level is controlled instead of the current level in order to provide relatively uniform anodization of the selected areas 20' of the tantalum layer 20 on the substrate 12. That is, across the substrate 12 which may have circuits (not shown) including such capacitors, portions of the tantalum layer 20 will have holes or defects in the area where such capacitors are being formed exposing a portion of the metal contact 16 to the electrolyte, and causing a short circuit to the substrate. Thus, if a constant current signal is applied during the oxidation process, a substantial portion of the current will be channeled through that defect to the substrate, leaving an insufficient amount of current to uniformly anodize the remainder of the tantalum layer 20. Here by controlling the voltage, the current is allowed to fluctuate. Thus, on wafers with few or no defects, the current level will be constant. On wafers with a large number of defects, the current level will not be constant but will fluctuate. While circuits (not shown) formed in areas of the substrate having a defect are not functional, the remainder of circuits formed on such a substrate are usable, and with this technique despite the presence of defects which will channel a portion of the available current through the defect to the substrate, the technique of letting the current vary while controlling the voltage provides a sufficient amount of current to provide a uniform anodization of the tantalum layer, despite the presence of some defects in other parts of the wafer. The area anodized on the substrate 12 is relatively small in relation to the tantalum layer 62 on the glass slide. Thus, the tantalum layer 62 acts as a ballast to control the amount of current and hence the rate of tantalum oxide generated from the exposed portion 20' of tantalum layer 20.

This provides a tantalum oxide film having a dielectric constant K of approximately K=21 and a thickness of approximately 1400 Angstroms. However, the thickness of the tantalum oxide film can be selectively controlled by controlling the peak voltage of the ramp. As is known in the art, the thickness of the oxide growth by anodization is a function of the voltage level applied. Further, details of anodization of tantalum are described in a book entitled *Thin Film Technology*, by Robert W. Berry et al, Van Nostrand Reinhold Company (New York, 1968), pp. 271-285. Thus, a tantalum oxide layer is grown from the exposed portion 20' of the tantalum layer 20.

Figure 5:
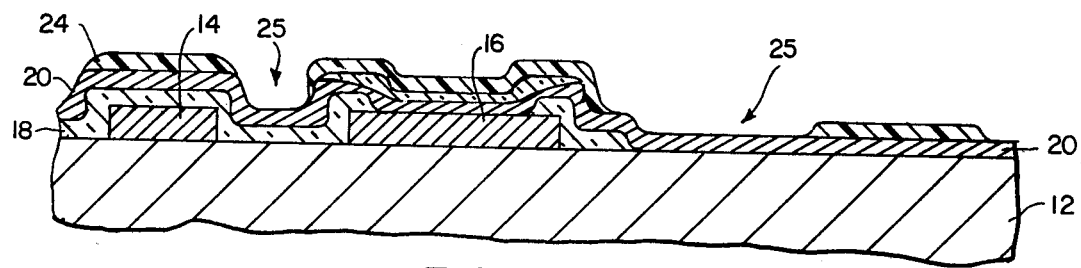

Referring now to FIG. 5 and FIG. 6, the substrate 12 is removed from the tub 70. The wax layer 62 is removed from the edge portions of the subsrate 12, and the substrate is cleaned of any residual wax or residue of the electrolyte, and the photoresist layer 22 is removed by conventional techniques. A second photoresist layer 24 is then applied over the substrate 12 and is patterned in selective areas 25 to provide an etching mask to pattern the actual lumped element structures. As shown in FIG. 6, selective portions of the silicon nitride layer 18, and tantalum layer 20 are etched away here by using a freon plasma etch (not shown) to define areas for the dielectric of each capacitor, and to provide a strip 20" of tantalum layer 20 for a tantalum resistor. As also shown in FIG. 6, top metal contacts 26, 28 are provided over remaining portions of the silicon nitride layer 18 and tantalum oxide layer 20', such metal contacts 26, 28 being aligned with corresponding pads 14, 16 thereunder. Further, a pair of metal contacts 29, 29' are formed on substrate 12 in contact with the area 20" of tantalum layer 20 to form a tantalum resistor 34 in a manner known in the art. Thus, as shown in FIG. 6, a silicon nitride dielectric capacitor 30 is provided in a first region, a tantalum oxide dielectric capacitor 32 is provided in a second region, and a tantalum film resistor 34 is provided in a third region of the wafer.

As previously described, nitrogen is introduced into the sputtering of tantalum to provide a nonstoichiometric layer 20 of tantalum and nitrogen (Ta:N(20%). With devices built in accordance with the invention, it is theorized that the incorporation of nitrogen will have significant, advantageous effects on the tantalum oxide capacitor 32 and tantalum film resistor 34. The first improvement believed to be in TCR (temperature coefficients of resistance) or the amount of change in resistance per unit change in temperature. In prior art tantalum film resistors, a TCR of $-150$ ppm/°C. were typical whereas with such resistor 34 fabricated in accordance with the invention, a TCR of less than 10 ppm/°C. may be obtained. A second potential improvement may occur in the TCC (temperature coefficient of capacitance) for tantalum oxide capacitor 32 (less than 150 ppm/°C.) whereas prior art structures were generally greater than 200 ppm/°C. It is also believed that incorporation of nitrogen will improve long term stability of the $Ta_2O_5$ film and the tantalum film forming the resistor 34. The use of nitrogen in a tantalum film for forming a tantalum oxide capacitor is described in an article entitled "Tantalum Film Capacitors with Improved A.C. Properties" by M. H. Rottersman et. al., IEEE Transactions Components, Hybrids, Man. Tech., Vol. CHMT-1, pp. 137-142; June 1978.

Thus, in accordance with the invention, during formation of an anodic oxide capacitor, such as would be required for circuit decoupling of d.c. power on bias lines, smaller silicon nitride dielectric capacitors, and thin film resistors (formed from the same metal as the anodic oxide) are simultaneously formed without any additional masking or processing steps.

Having described a preferred embodiment of the invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. A method of forming an anodic oxide dielectric capacitor on a metal contact disposed on a substrate comprising the steps of:
   depositing a layer of an insulating material on the metal contact and substrate;
   providing an aperture in the insulating layer aligned with the metal contact, exposing such metal contact;
   providing a layer of a valve metal on said insulating layer and on the metal contact;
   anodizing a portion of the valve metal layer substantially confined to the area of the valve metal layer disposed on the metal contact to provide an anodic oxide dielectric; and
   plating a second metal contact over said anodic oxide dielectric.

2. The method as recited in claim 1 wherein during the step of providing the valve metal on the insulating layer, a predetermined amount of nonstoichiometric formation agent is introduced to provide a nonstoichiometric layer of the valve metal and the agent.

3. The method as recited in claim 2 wherein the nonstoichiometric formation agent is nitrogen.

4. A method of forming a capacitor on a substrate comprising the steps of:
   forming a first electrode of the capacitor over an underlying portion of the substrate;
   providing an insulating layer on peripheral portions of the electrode and on portions of the substrate adjacent the underlying portion;
   providing a conductive layer over an inner surface portion of the electrode disposed within the peripheral portions and over the insulating layer;
   converting said inner portion of the conductive layer into a dielectric layer; and
   providing a second electrode over the dielectric layer.

5. A method of forming an anodic oxide dielectric capacitor on a metal contact disposed on a substrate comprising the steps of:
   providing a protective layer on the surface of the substrate and edge portion of the metal contact;
   providing a valve metal on the unprotected portion of the metal contact and the protective layer;
   converting a portion of the valve metal layer on the unprotected portion of the metal contact into a layer of an oxide of such valve metal while confining such oxide of such valve metal substantial to the surface of the metal contact; and
   providing a second metal contact on the oxide of the valve metal.

6. The method as recited in claim 5 wherein during the step of providing the valve metal layer, a predetermined amount of a nonstoichiometric formation agent is introduced to provide a nonstoichiometric layer of the valve metal and the agent.

7. The method as recited in claim 6 wherein the nonstoichiometric formation agent is nitrogen.

8. A capacitor formed in a substrate comprising:
   a first metal contact disposed over the substrate;
   a region of an insulating material disposed over peripheral edge portions of the first metal contact;
   a layer of a valve metal disposed over the insulating region and the first contact;
   a layer of an oxide of the valve metal on the layer of the valve metal; and
   a second metal contact disposed over the valve metal oxide.

9. The capacitor as recited in claim 8 wherein the layer of the valve metal oxide includes nitrogen and has a nonstoichiometric structure.

10. A method of forming a first capacitor having a dielectric of a first material, a second capacitor having a dielectric of an oxide of a second material and a resistor comprising the steps of:
    forming a pair of electrodes on a substrate;

depositing a layer of such first material on the electrodes and substrate;

providing a first aperture in said layer, aligned with one of said electrodes and a second aperture exposing a portion of the substrate;

depositing a layer of a second material in said first and second apertures;

converting a portion of said second material disposed in the first aperture to an oxide of such second material; and providing a contact over each of said pair of electrodes providing such capacitors and a pair of electrodes on said second material disposed on said second aperture providing such resistor.

11. A method of forming an anodic oxide dielectric capacitor having an electrode disposed on a substrate comprising the steps of:

providing a protecting layer on a portion of the electrode;

providing a conductive layer on an unprotected portion of the metal layer;

converting the conductive layer into the anodic oxide dielectric layer; and providing a second electrode on the anodic oxide dielectric.

12. A method of forming a first capacitor having a dielectric of a first material, a second capacitor having a dielectric of a second material and a resistor comprising the steps of:

forming a pair of electrodes on a substrate;

depositing a layer of such first material on the electrodes and substrate;

providing a first aperture in said layer, aligned with one of said electrodes and a second aperture exposing a portion of the substrate;

depositing a layer of a conductive material in said first and second apertures;

converting said conductive material disposed in the first aperture into the second dielectric; and providing a contact over each of said pair of electrodes providing such capacitors, and a pair of electrodes on said second material disposed in said second aperture providing such resistor.

13. A capacitor formed on a substrate comprising:

a first metal contact disposed over an underlying portion of the substrate;

a layer of silicon nitride provided on peripheral portions of the contact and portions of the substrate adjacent the underlying portion;

a layer of tantalum deposited on inner portions of the first metal contact and the silicon nitride layer;

a layer of tantalum oxide disposed on the inner portion of the tantalum layer; and a second metal contact provided on the tantalum oxide layer.

14. The capacitor as recited in claim 13 wherein the tantalum oxide layer includes nitrogen and has a non-stoichiometric structure.

* * * * *